US012422469B2

(12) United States Patent
Wilson et al.

(10) Patent No.: US 12,422,469 B2
(45) Date of Patent: Sep. 23, 2025

(54) DEVICES AND METHODS FOR SURGE PROTECTION DEVICE MONITORING

(71) Applicant: ASCO Power Technologies, L.P., Florham Park, NJ (US)

(72) Inventors: Glenn Edward Wilson, Endicott, NY (US); Matthew Arthur Scott, Vestal, NY (US); Daniel George Buchanan, Vestal, NY (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 0 days.

(21) Appl. No.: 18/205,652

(22) Filed: Jun. 5, 2023

(65) Prior Publication Data

US 2023/0349967 A1    Nov. 2, 2023

Related U.S. Application Data

(60) Continuation of application No. 17/732,896, filed on Apr. 29, 2022, now Pat. No. 11,709,197, which is a continuation of application No. 17/089,912, filed on Nov. 5, 2020, now Pat. No. 11,360,141, which is a division of application No. 16/431,939, filed on Jun. 5, 2019, now Pat. No. 10,866,274, which is a division of application No. 15/134,244, filed on Apr. 20, 2016, now Pat. No. 10,345,372.

(60) Provisional application No. 62/151,117, filed on Apr. 22, 2015.

(51) Int. Cl.
*G01R 31/28* (2006.01)
*G01R 31/20* (2006.01)
*G01R 31/26* (2020.01)
*H02H 9/04* (2006.01)

(52) U.S. Cl.
CPC ......... *G01R 31/2827* (2013.01); *H02H 9/042* (2013.01)

(58) Field of Classification Search
CPC ........ G01R 31/02; G01R 31/20; G01R 31/26; G01R 31/28; H02H 9/04
See application file for complete search history.

(56) References Cited

U.S. PATENT DOCUMENTS 5,553,012 A    9/1996  Buss et al.
5,894,212 A    4/1999  Balogh
2006/0279885 A1 * 12/2006  Sung ..................... H02H 9/042
                                                                            361/42

(Continued)

*Primary Examiner* — Neel D Shah
(74) *Attorney, Agent, or Firm* — Troutman Pepper Locke LLP

(57) ABSTRACT

Example devices and methods for compensating for monitoring a surge protection device are provided. In some embodiments, a device is configured to couple to a surge protection device. The device comprises a processor that is capable of sending a DC current signal. A serial data interface is electrically connected to the processor and includes at least one shift register. The device also comprises a multiplexer coupled to the serial data interface. The serial data interface is operable to direct the DC current through the multiplexer. The device also comprises an analog to digital converter (optionally embedded within the processor) that is operable to output a digital signal corresponding to a voltage induced by the DC current signal. Returned DC signals represent surge protection device's health and a multitude of other surge module information.

17 Claims, 7 Drawing Sheets

(56) References Cited

U.S. PATENT DOCUMENTS

| | | |
|---|---|---|
| 2009/0207034 A1 | 8/2009 | Tinapphong et al. |
| 2012/0004873 A1* | 1/2012 | Li .................... G01R 31/36 |
| | | 320/134 |
| 2016/0028226 A1 | 1/2016 | Kuo |
| 2019/0353694 A1 | 11/2019 | Kim et al. |
| 2019/0372332 A1* | 12/2019 | Khosla ............... H01H 71/12 |
| 2022/0021204 A1* | 1/2022 | Xu ...................... H02H 3/02 |

* cited by examiner

DEVICES AND METHODS FOR SURGE PROTECTION DEVICE MONITORING

CROSS REFERENCE TO RELATED APPLICATION

The present application is a continuation of and claims priority to U.S. patent application Ser. No. 17/732,896, filed on Apr. 29, 2022, which is a continuation of and claims priority to U.S. patent application Ser. No. 17/089,912, filed on Nov. 5, 2020, which is a division of and claims priority to U.S. patent application Ser. No. 16/431,939, filed on Jun. 5, 2019, which is a division of and claims priority to U.S. patent application Ser. No. 15/134,244, filed on Apr. 20, 2016, which claims priority to U.S. Provisional patent application Ser. No. 62/151,117, filed on Apr. 22, 2015, and entitled "Devices and Methods for Surge Protection Device Monitoring," which are herein incorporated by reference as if fully set forth in this description.

BACKGROUND

Surge protection may be accomplished by connecting surge protection components between voltage lines that limit the voltage difference between those lines. This clamping effect will limit the voltage at that connection point by drawing current whenever the voltage exceeds the rating of the clamp. By the surge protection component drawing current, this helps protect equipment that is connected downstream from the surge protection component. This protection method may be beneficial for multiple reasons including, for example, ease of installation, the size of the connection conductors and the surge protection component's independence from the size and nature of the equipment being protected.

Surge protection components are sacrificial components in electrical systems. In other words, surge protection components are designed to wear and eventually require replacement. Many surge protection components, such as Metal Oxide Varistors (MOVs), wear out to a short circuit or low ohm value in a very rapid transition. Thus, surge protection components may be protected by fuse elements to ensure power delivery to other equipment in the event of a failure of the surge protection component.

Monitoring the status of these surge protection components may be very important. For example, a protection element that has worn or failed may need to be repaired or replaced such that proper surge protection of downstream equipment can be restored. Many manufacturers of surge protection components include ways to monitor the health, or status, of a surge protection component. For example, a surge protection component may be manufactured to include an internal fuse or switch. In another example, a surge protection component may include filtering capacitors, protection elements connected in parallel, protection elements connected in series, or active protection elements. One example of an active protection element is the shunt voltage regulator described in U.S. Pat. No. 5,856,740.

Multi-mode surge protection devices are devices which comprise a number of surge protection device components within a single package. For example, these "modes" of protection can be connected line-to-line (LL or L-L), line-to-neutral (LN or LN), line-to-ground (LG or L-G), and neutral-to-ground (NG or N-G) across three phases (e.g., A, B, and C). Two example of multi-mode surge protection devices are 7-mode and 10-mode devices.

Thus, a need exists to monitor the status (i.e., the health) of these surge protection components. For example, a monitoring device may need to identify various surge protection device information, such as the type of technology, particular setups, particular configurations, surge capacities, temperature, number and/or type of components, calibration settings, and/or technologies or equipment to which it is connected. This identification may require detail about the exact technology and configuration of the connected product(s). For example, this identification may require detail about the surge protective device technology, the number of protected modes, the amount of installed protection, and the physical location, among other details. Moreover, safety requirements may require a monitoring device to provide isolation between power lines and any user operating the monitoring device.

SUMMARY

Within one example, a device is configured to couple to a surge protection device. The device comprises a processor that sends a DC current signal. A serial data interface is electrically connected to the processor and includes at least one shift register. The device also comprises a multiplexer electrically connected to the serial data interface. The serial data interface directs the DC current signal through the multiplexer. The device also comprises an analog to digital converter electrically connected to the processor and the multiplexer that outputs a digital signal corresponding to a voltage induced by the DC current signal. In some embodiments, the analog to digital converter is embedded within the processor.

In another example, a device is configured to couple to a surge protection device. The device comprises a processor that is capable of sending a DC current signal. The device also comprises a serial data interface electrically connected to the processor. The serial data interface comprises a first shift register and a second shift register. The device also comprises a plurality of multiplexers coupled to the serial data interface. The serial data interface is capable of directing the DC current through the plurality of multiplexers. The device also comprises an analog to digital converter electrically connected to the processor and the multiplexer that is capable of outputting a digital signal corresponding to a voltage induced by the DC current signal.

In another example, a method is provided that comprises detecting, by a monitoring device, the presence of one or more surge protection device components. The method also comprises generating, by the monitoring device, a list of measurement locations based on the detected one or more surge protection device components. The method also comprises measuring, by the monitoring device for each measurement location, a status of the one or more surge protection device components. The method also comprises generating, by the monitoring device, an output. The generated output is based at least in part on the status of the one or more surge protection device components.

In another example, a method is provided that comprises coupling a monitoring device to a surge protection device. The method also comprises sending, from the monitoring device, a DC current signal to a surge protection device component. The DC current signal generates an induced voltage at the surge protection device component. The method also comprises determining, by the monitoring device, a status of the surge protection device component based on the induced voltage. The method also includes generating, by the monitoring device, an output capable of being displayed on a display device. The generated output is based at least in part on the status of the one or more surge protection device components.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

Figure 1:
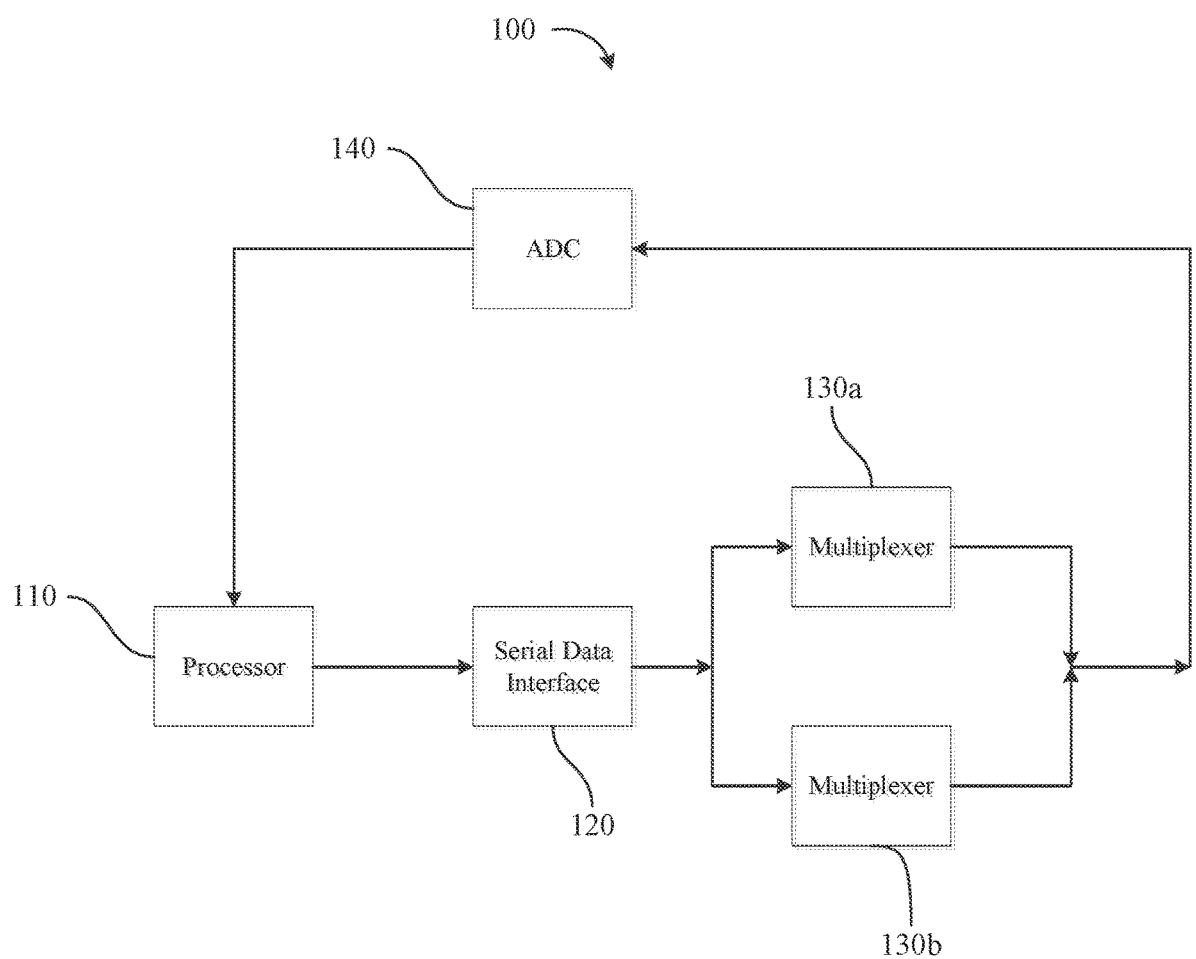
FIG. 1 is a block diagram representing an example device for monitoring surge protection components.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Referring now to the figures, FIG. 1 illustrates an example device 100 for monitoring surge protection components. The device 100 includes a processor 110, a serial data interface 120, multiplexers 130a and 130b, and an analog to digital converter 140.

The processor 110 is capable of sending a DC current signal and is electrically connected to the serial data interface 120. The serial data interface 120 includes one or more shift registers, or serial to parallel latches, that are electrically connected to one or more multiplexers 130 (represented in FIG. 1 as multiplexer 130a and multiplexer 130b). The multiplexers may be digital or analog multiplexers. The one or more multiplexers 130 are electrically connected to an analog to digital converter 140. The analog to digital converter 140 is electrically connected to the processor 110 (in some embodiments, the processor may include an analog to digital converter). The multiplexers 130 may be connected to one or more surge protection device components (not shown), such as varistors, thermistors, resistors, capacitors, inductors, fuses, and sensors, among others.

Processor(s) 110 may be a general-purpose processor or a special purpose processor (e.g., digital signal processors, application specific integrated circuits, etc.). The processor(s) 110 can be configured to execute computer-readable program instructions that are stored in data storage and are executable to provide the functionality of the device 100 described herein. For instance, the program instructions may be executable to provide functionality of one or more multiplexers 130 and the analog to digital converter 140.

It will be readily understood that the aspects of the present disclosure, as generally described herein, and illustrated in the figures, can be arranged, substituted, combined, separated, and designed in a wide variety of different configurations, all of which are explicitly contemplated herein. For example, processor 110 may include one or more components, such as the analog to digital converter 140.

The data storage may include or take the form of one or more computer-readable storage media that can be read or accessed by processor(s) 110. The one or more computer-readable storage media can include volatile and/or non-volatile storage components, such as optical, magnetic, organic or other memory or disc storage, which can be integrated in whole or in part with processor(s) 110. In some embodiments, the data storage can be implemented using a single physical device (e.g., one optical, magnetic, organic or other memory or disc storage unit), while in other embodiments, the data storage can be implemented using two or more physical devices. Further, in addition to the computer-readable program instructions, the data storage may include additional data such as diagnostic data, among other possibilities.

In operation in some embodiments, the processor 110 sends a DC current signal to the serial data interface 120. The serial data interface 120 is used to direct the DC current through the one or more multiplexers 130. The one or more multiplexers 130 are connected to one or more surge protection device components, and the DC current signal induces a voltage across the one or more surge protection device components. In some embodiments, only one multiplexer is enabled at a time, thereby providing only one valid path for current. In other embodiments, more than one multiplexer may be enabled at a time. After the DC current signal has been directed by the serial data interface 120 and a settling time has elapsed to help minimize anomalies in induced voltages, the analog to digital converter 140 measures the analog voltage and converts the analog voltage into a corresponding digital signal. A settling time that is sufficient to settle out any anomalies in the induced voltage may be, for example, 100 milliseconds. However, other settling times may be used as well.

In some embodiments, the device 100 may be monitoring metal oxide varistors ("MOVs") that include isolated switches for signaling health, or status, of the MOVs. The device 100 may monitor this type of MOV by using a monitoring resistor (or a series of resistors) in parallel with the isolated switch. Devices operating according to these embodiments would use the DC current signal to induce a voltage across this parallel circuit (instead of, or in addition to, the one or more surge protection device components). Then, the device 100 would similarly use the analog to digital converter 140 to measure the induced voltage across this parallel circuit, which will indicate the health, or status, of the MOV. As long as the processor 110 knows the normal state of the MOV isolated switch, this implementation can work regardless of that normal state.

Figure 5:
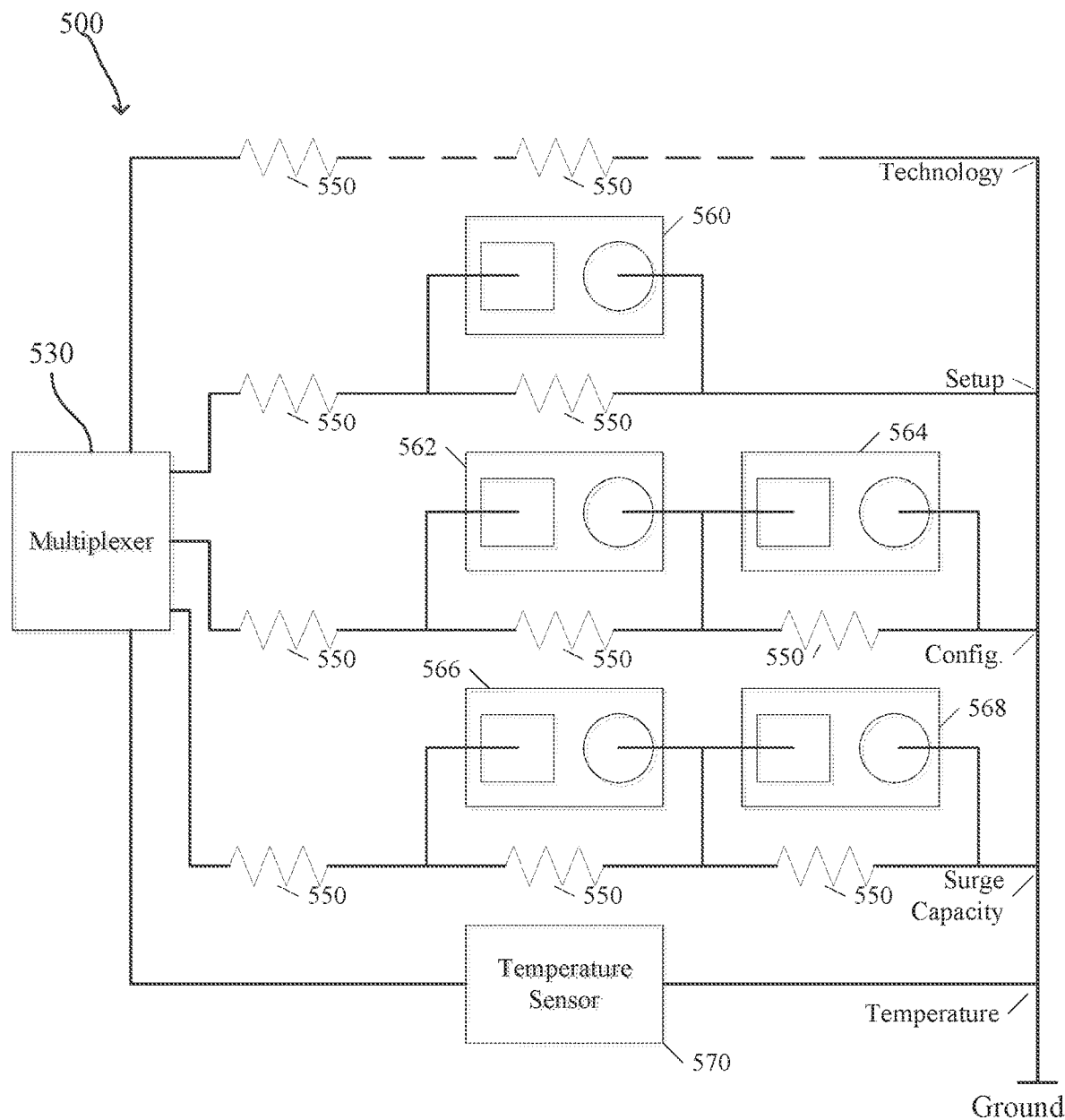
FIG. 5 illustrates a block diagram representing a portion of an example device 500 for determining information about the components under protection.
Figure 6:
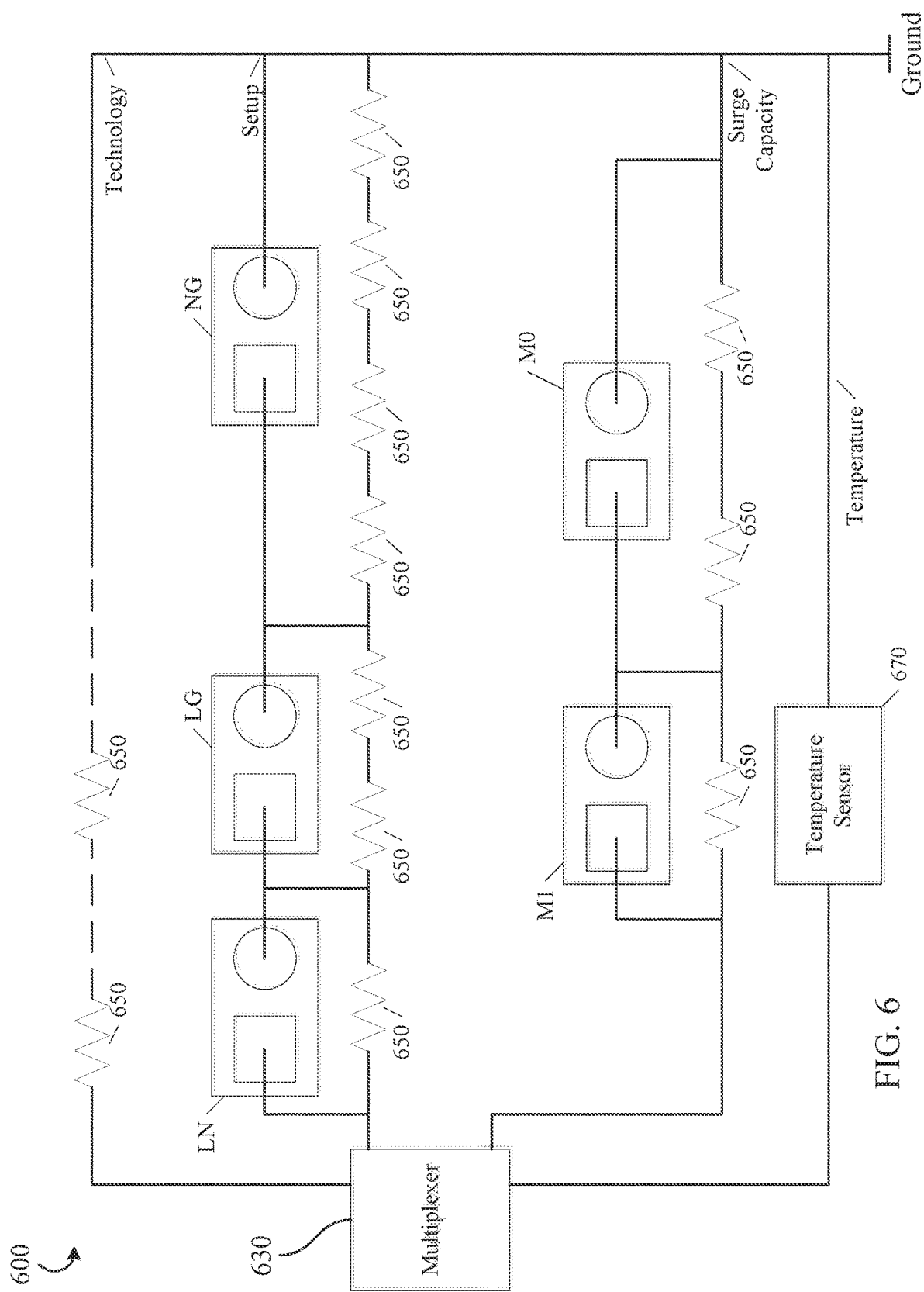
FIG. 6 illustrates a block diagram representing a portion of an example device 500 for determining information about the components under protection.

To ease implementation, MOVs that serve the same or similar purposes can be connected in series. For MOVs connected in series, the processor 110 must know how many MOV circuits it is measuring at that time. As discussed further below, FIGS. 5 and 6 illustrate, among other things, some examples of how to measure surge capacity (e.g., how many MOVs are connected in series), the technology identification, configuration information, temperature and other information related to component status (e.g., MOV health, fuse status, how many MOV circuits are being measured, etc.).

The processor 110 may receive information related to various aspects of monitored devices from a variety of sources. In regards to the various aspects of monitored devices, the processor 110 may receive information related to technology identification, configuration, calibration, temperature, and component status, among others. The processor 110 may receive this information from a variety of sources. For example, the processor 110 may determine this information by comparing measurements to a database, or list of information. For example, a manufacturer may have a database that contains a list of its surge protective devices and their related technology, configurations, calibrations, and other features. The processor 110 may be electrically connected to data storage where it can store the database. The processor 110 may then compare measurements (e.g., from the analog to digital converter 140) to the list of information. In another example, device 100 may include an input device (e.g., a keyboard and mouse, touchscreen interface, personal computer, or other computing device) such that the processor 110 can receive input information.

In some examples, conditions within a surge protection device are better monitored using additional circuitry. This type of condition may be monitored with a transistor switch, as long as the circuit type and voltage thresholds are known by the processor 110.

In some examples, the device 100 may measure the temperature of a surge protection device component. For example, instead of (or in addition to) a monitoring resistor as described above in reference to MOV monitoring, the device 100 may use any temperature sensor, such as a voltage based temperature sensor. For example, a switch based temperature sensor, a threshold based temperature sensor, or a continuous based temperature sensor (such as a thermistor) may be electrically connected to a surge protection device component and the device 100.

Figure 2:
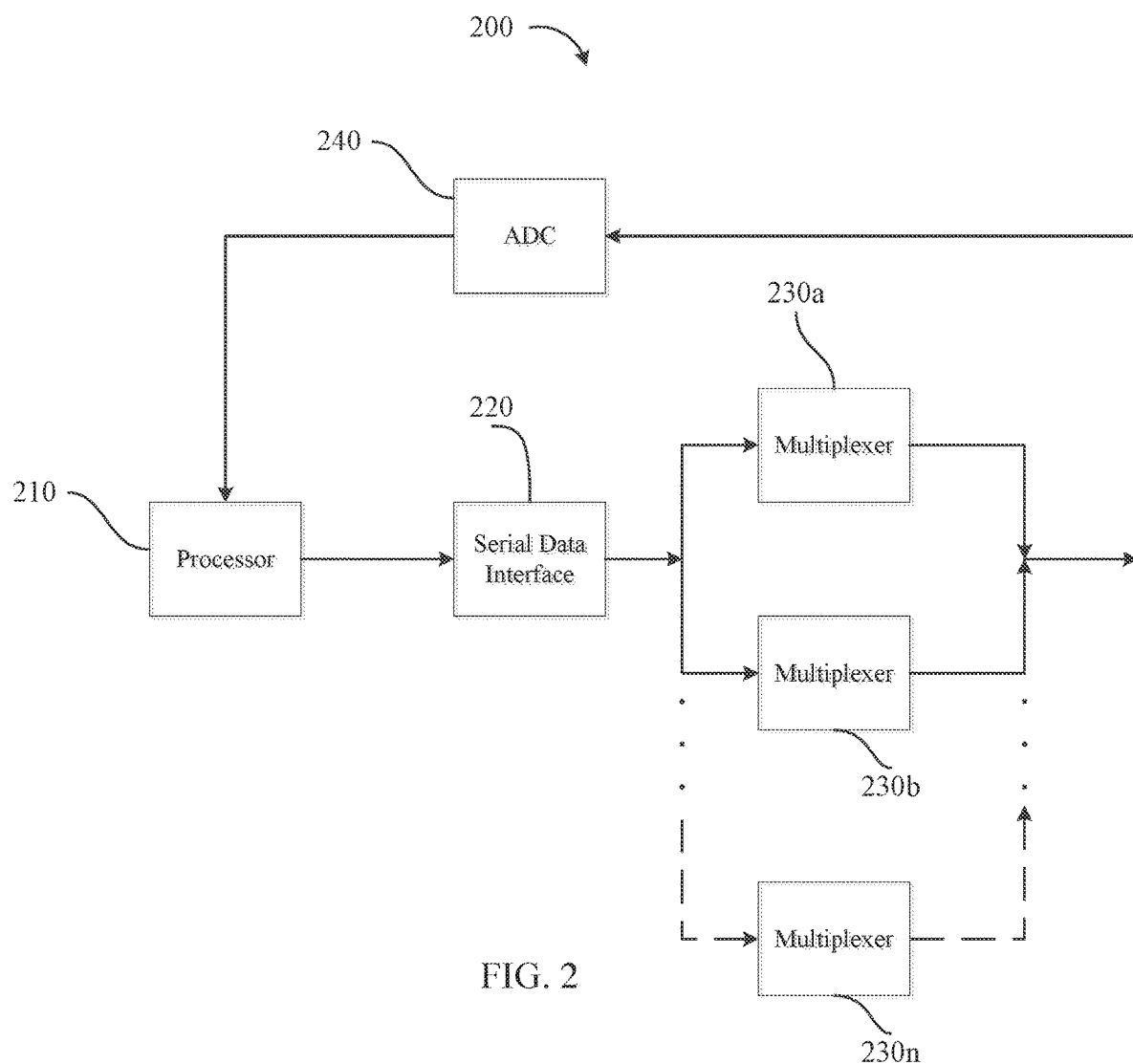
FIG. 2 is a block diagram representing an example device for monitoring surge protection components.

FIG. 2 illustrates a block diagram representing an example device 200 for monitoring surge protection components. The device 200 includes a processor 210, a serial data interface 220, a plurality of multiplexers 230 (represented in FIG. 2 by multiplexer 230*a*, multiplexer 230*b* . . . multiplexer 230*n*), and an analog to digital converter 240. Components illustrated in FIG. 2 may be similar, and operate in a similar manner, to components described above in reference to FIG. 1.

The processer 210 is capable of sending a DC current signal and is electrically connected to the serial data interface 220. The serial data interface 220 includes one or more shift registers, or serial to parallel latches, that are electrically connected to a plurality of multiplexers 230 (represented in FIG. 2 as multiplexer 230*a*, multiplexer 230*b*, through multiplexer 230*n*). The multiplexers may be digital or analog multiplexers. The plurality of multiplexers 230 are electrically connected to an analog to digital converter 240. The analog to digital converter 240 is electrically connected to the processor 210. The plurality of multiplexers 230 may be connected to one or more surge protection device components (not shown), such as varistors, thermistors, resistors, capacitors, inductors, fuses, and sensors, among others.

In operation in some embodiments, the processor 210 sends a DC current signal to the serial data interface 220. The serial data interface 220 is used to direct the DC current through the plurality of multiplexers 230. The plurality of multiplexers 230 are connected to one or more surge protection device component's isolated switches, and the DC current signal induces a voltage across the one or more surge protection device component's isolated switches. In normal operation, only one multiplexer is enabled at a time, thereby providing only one valid path for current. After the DC current signal has been directed by the serial data interface 220 and a settling time has elapsed, the analog to digital converter 240 measures the analog voltage and converts the analog voltage into a corresponding digital signal. A settling time that is sufficient to settle out any anomalies in the induced voltage may be, for example, 100 milliseconds. However, other settling times may be used as well.

Figure 7:
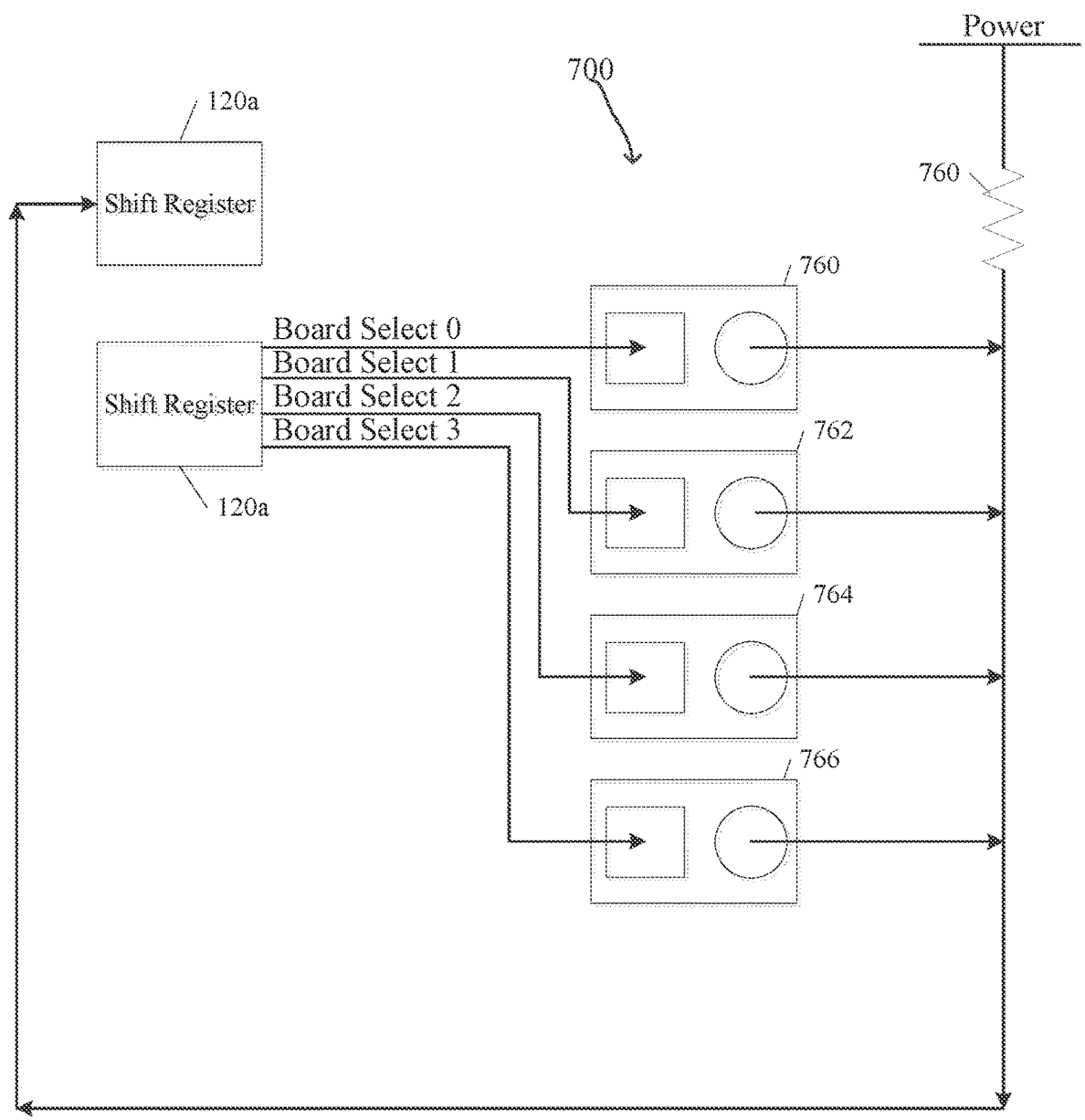
FIG. 7 illustrates a block diagram representing a portion of an example device 700 for module selection.

In some embodiments, serial data interface 220 includes two shift registers that interface with four multiplexers 230. The first shift register produces all of the multiplexer control signals while the second shift register is responsible for module addressing (or module selection). Module addressing may be accomplished in various ways. For example, FIG. 7 illustrates a block diagram representing a portion of an example device 700 for module selection. Example device 700 is intended only to illustrate the module selection components and operation, and may be a part of a larger device, e.g., example devices 100 or 200 and thus may include additional components.

Example device 700 includes a first shift register 720*a*, a second shift register 720*b*, a resistor 750, and connections 760, 762, 764, and 766. In some embodiments, connections 760, 762, 764, and 766 are isolated switches. In operation, a module is selected based on which of the connections is shorted. For example, in some embodiments, module addressing (or selection) may occur according to the following table:

| | Module Selection | | | |
|---|---|---|---|---|
| Module # | 760 | 762 | 764 | 766 |
| 1/Single | Shorted | Open | Open | Open |
| 2 | Open | Shorted | Open | Open |
| 3 | Open | Open | Shorted | Open |
| 4 | Open | Open | Open | Shorted |

In some embodiments, the output of the first shift register (e.g., 720*a*) is enabled when the proper output bit of the second shift register (e.g., 720*b*) is low.

In addition to module selection, example devices may further determine information about the components under protection. For example, a multiplexer (e.g., 130*a*) may be electrically connected to one or more components that indicate or correspond to the information about the components under protection. Examples of information related to the surge protection device components may include technology identification, setup information, configuration information, surge capacity, temperature measurements, calibration, and/or sense modes (e.g., as illustrated and described further in FIGS. 5 and 6).

FIG. 5 illustrates a block diagram representing a portion of an example device 500 for determining information about the components under protection. Example device 500 is intended only to illustrate portions of the components and operation and may be a part of a larger device, e.g., example devices 100 or 200 that include additional components. Example device 500 includes multiplexer 530, resistors 550, connections 560, 562, 564, 566, and 568. Although the resistors 550 are all shown here as being identical in resistance values, other resistances could be used as well.

Information related to the technology identification may be determined by, e.g., the measured voltage across a resistor string (i.e., a resistor or series of resistors). As shown in FIG. 5, the dotted lines represent the addition of one or more resistors to the resistor string that is used to identify the technology. For example, in some embodiments, technology identification may occur according to the following table:

| Technology Identification | | |
|---|---|---|
| Measured Voltage | Function | PCB |
| 75 mV to 225 mV | R2/LM Interface | 7578 board |
| 226 mV to 375 mV | 440 Series | 7568 |

Information related to the setup may be determined, e.g., by the measured voltage across a resistor string in combination with connections (e.g., connections 560, 562, 564, 566, and 568). In some embodiments, the connections may be isolated switches connected in parallel to one or more resistors. For example, in some embodiments, setup information may be determined as illustrated in FIG. 5 (e.g., for connection 560 and its corresponding resistor string) and according to the following table:

| Setup | |
|---|---|
| Measured Voltage | Function |
| 75 mV to 225 mV | 10-Mode |
| 226 mV to 375 mV | 7-Mode |
| Otherwise | Customizable |

If the setup string returns a voltage outside of a predetermined range, the device (e.g., devices 100 or 200) may be configured with a customizable response, such as affecting the monitored health of the protected component, returning an error message, or other information.

Information related to the configuration of the surge protection components may be determined, e.g., by the measured voltage across a resistor string in combination with connections. For example, in some embodiments, configuration of the protected components may be determined as illustrated in Figure S (e.g., for connections 562 and 564 and the corresponding resistor string) and according to the following table:

| Configuration | |
|---|---|
| Measured Voltage | Function |
| 75 mV to 225 mV | Split-phase MOVs |
| 226 mV to 375 mV | Delta MOVs (No N-G) |
| 376 mV to 525 mV | All MOV Modes |
| Otherwise | Customizable |

Information related to the surge capacity of the surge protection components may be determined, e.g., by the measured voltage a resistor string in combination with connections. For example, in some embodiments, surge capacity of the protected components may be determined as illustrated in FIG. 5 (e.g., for connections 566 and 568 and the corresponding resistor string) and according to the following table:

| Surge Capacity | |
|---|---|
| Measured Voltage | Function |
| 75 mV to 225 mV | 1 MOV per Mode |
| 226 mV to 375 mV | 2 MOVs per Mode |
| 376 mV to 525 mV | 3 MOVs per Mode |
| Otherwise | Customizable |

Other information related to the protected components may be determined as well. For example, resistor strings may be used as an indication of 7-Mode and 10-Mode calibration. Additionally, a temperature sensor 570, such as those described above, may be used to determine temperature of the protected component. In a similar vein as that described above in reference to determining information about the protected components, a sense mode may be used to sense whether MOVs have failed within a protected component. In some embodiments, a sense mode may contain a series of four resistors 550 in a resistor string and three connections connected in parallel to three respective resistors. In the sense mode, failure of MOVs may be determined according to the following table:

| Sense Modes | | |
|---|---|---|
| Measured Voltage | 7-Mode Function | 10-Mode Function |
| 0 mV to 75 mV | 3 MOVs Failed | 2 MOVs Failed |
| 75 mV to 225 mV | 2 MOVs Failed | 1 MOV Failed |
| 226 mV to 375 mV | 1 MOV Failed | Pass |
| 376 mV to 525 mV | Pass | Customizable |
| Otherwise | Customizable | Customizable |

FIG. 6 illustrates a block diagram representing a portion of an example device 500 for determining information about the components under protection. Example device 600 is intended only to illustrate portions of the components and operation and may be a part of a larger device, e.g., example devices 100 or 200 that include additional components. Example device 600 includes multiplexer 630, resistors 650, and connections LN, LG, NG, MI and MO. Although the resistors 650 are all shown here as being identical in resistance values, other resistances could be used as well.

Information related to the technology identification may be determined by, e.g., the measured voltage across a resistor string (i.e., a resistor or series of resistors). As shown in FIG. 6, the dotted lines represent the addition of one or more resistors to the resistor string that is used to identify the technology. For example, in some embodiments, technology identification may occur according to the following table:

| Technology Identification | | |
|---|---|---|
| Measured Voltage | Function | PCB |
| 75 mV to 225 mV | R2/LM Interface | 7578 board |
| 226 mV to 375 mV | 440 Series | 7568 |
| 376 mV to 525 mV | 600 Series | 7583 |

Information related to the setup may be determined, e.g., by the measured voltage across a resistor string in combination with connections (e.g., connections LN, LG, and NG). In some embodiments, the connections may be isolated switches connected in parallel to one or more resistors of the resistor string, as well as protected components. For example, in some embodiments, setup information may be determined as illustrated in FIG. 6 (e.g., for connections LN, LG, and NG and the corresponding resistor string) and according to the following table:

| Setup | | | |
|---|---|---|---|
| Measured Voltage | LN | LG | NG |
| 75 mV to 225 mV | X | X | |
| 226 mV to 375 mV | | X | |
| 376 mV to 525 mV | X | | |
| 526 mV to 675 mV | | | X |
| 676 mV to 825 mV | X | | X |
| 826 mV to 975 mV | | X | X |
| 976 mV to 1.125 V | X | X | X |

If the setup string returns a voltage outside of a predetermined range, the device may be configured with a customizable response, such as affecting the monitored health of the protected component, returning an error message, or other desirable functions.

Information related to the configuration of the surge protection components may be determined, e.g., by the measured voltage across a resistor string in combination with connections as described previously.

Information related to the surge capacity of the surge protection components may be determined, e.g., by the measured voltage a resistor string in combination with connections. For example, in some embodiments, surge capacity of the protected components may be determined as illustrated in FIG. 6 (e.g., for connections MI and MO and the corresponding resistor string) and according to the following table:

| Surge Capacity | |
|---|---|
| Measured Voltage | # Modules Present |
| 75 mV to 225 mV | 2 |
| 226 mV to 375 mV | 3 |
| 376 m V to 525 mV | 4 |
| 526 mV to 675 mV | 5 |
| Otherwise | Customizable |

Other information related to the protected components may be determined as well. For example, resistor strings may be used as an indication of 7-Mode and 10-Mode calibration. Additionally, a temperature sensor (e.g., temperature sensor 670), such as those described above, may be used to determine temperature of protected components. In a similar vein as that described above in reference to determining information about the protected components, a sense mode may be used to sense whether MOVs have failed within a protected component. In some embodiments, a sense mode may contain a series of four resistors 650 in a resistor string and three connections connected in parallel to three respective resistors. Alternatively, a pass/fail latch may be used.

Other information about the equipment being monitored (e.g., voltage configuration, depopulation, and MOV rating, among others) can be input to the processor 210 in other ways, for example, those described above in reference to FIG. 1.

The second multiplexer is electrically connected to the 7-mode measurements and calibration string. The third and fourth multiplexers are electrically connected to the 10-mode measurements and calibration string. In this example, the device 200 may also include one or more negative temperature coefficient thermistors, electrically connected to one or more corresponding surge protection device components, for measuring the temperature of the surge protection device component.

In some embodiments, the surge protection device is based on parallel MOV's with isolated switch outputs. The isolated switch outputs are arranged in series such that each protection mode (e.g., A-N, C-G, N-G, L-N, L-L, A-B, etc.) is represented as a single string. Thus, the device 200 can detect the status, or health, of individual MOV signals and the protection mode can be signaled as having reduced protection. For example, the device 200 may be capable of outputting a display signal that is capable of being displayed on a display device. For example, device 200 may be connected to a monitor and may display an alert that a protection mode has reduced protection. Alternatively, device 200 may be wirelessly (or wired) connected to a computing device (e.g., a smartphone, laptop, tablet, etc.) and may generate an output that is capable of displaying an alert on the wirelessly connected computing device.

In some embodiments, the 7-mode configuration has a maximum of three MOVs per mode and has a calibration string with three resistors in series. In another example, the 10-mode configuration has a maximum of two MOVs per mode and has a calibration string with two resistors in series. Other protection modes and configurations may work equally well with devices (e.g., devices 100, 200, 500, and 600), provided the processor 210 is properly setup.

Figure 3:
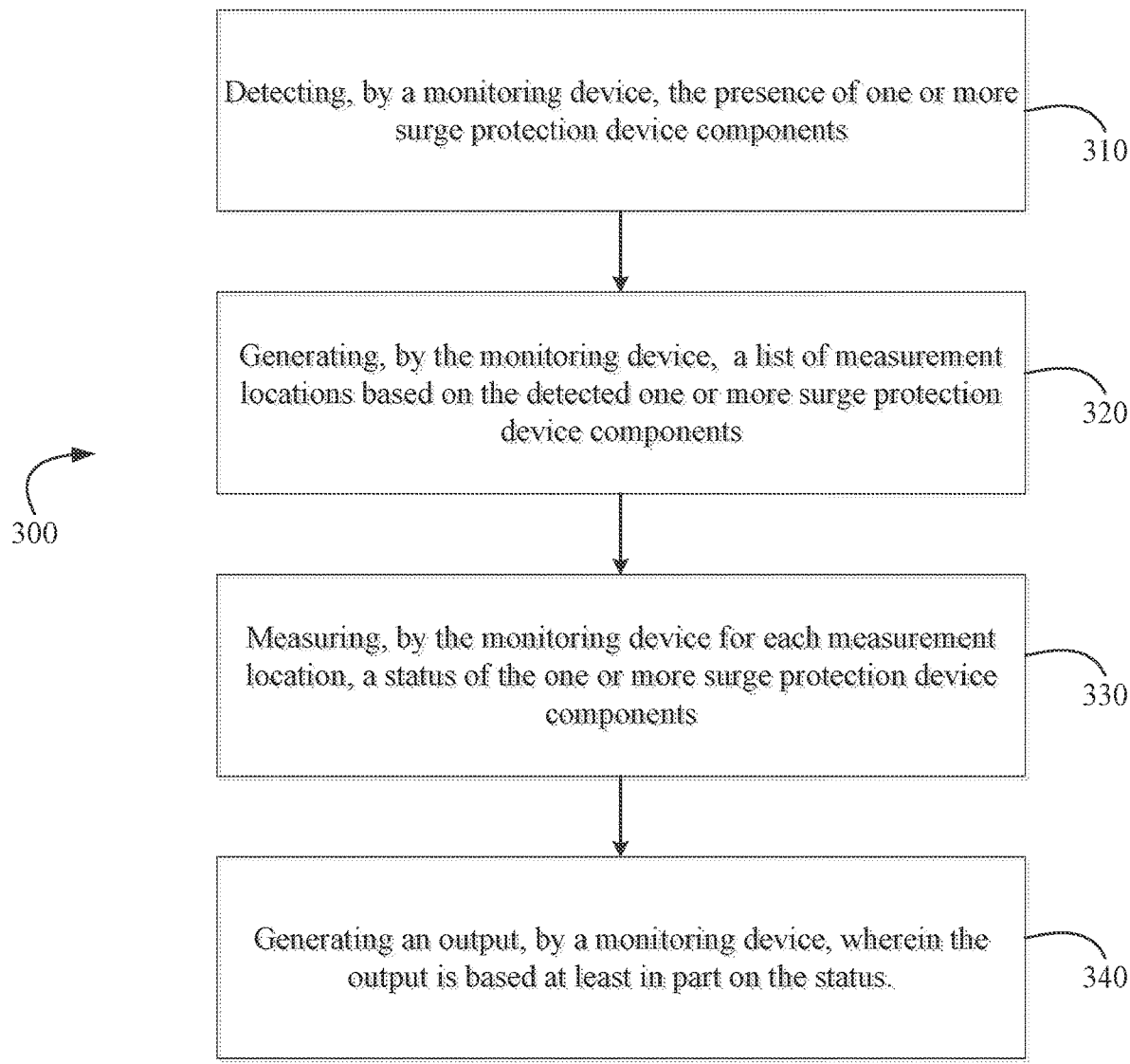
FIG. 3 is a flow chart of an example method for monitoring surge protection components.

FIG. 3 is a flow chart of an example method for monitoring surge protection components. Method 300 shown in FIG. 3 presents an embodiment of a method that could be used by the device 100 in FIG. 1, the device 200 in FIG. 2, or components of any of the above, for example. It should be understood that for this and other processes and methods disclosed herein, the flowchart shows functionality and operation of one possible implementation of present embodiments. In this regard, each block or portion of blocks may represent a module, a segment, or a portion of program code, which includes one or more instructions executable by a processor or computing device for implementing specific logical functions or steps in the process. The program code may be stored on any type of computer readable medium, for example, such as a storage device including a disk or hard drive. The computer readable medium may include transitory computer readable medium, for example, such as computer-readable media that stores data for short periods of time like register memory, processor cache and random access memory (RAM). The computer readable medium may also include non-transitory media, such as secondary or persistent long term storage, like read only memory (ROM), optical or magnetic disks, or compact-disc read only memory (CD-ROM), for example. The computer readable media may also be any other volatile or non-volatile storage systems. The computer readable medium may be considered a computer readable storage medium, for example, or a tangible storage device.

In addition, for the method 300 and other processes and methods disclosed herein, each block may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

At block 310, the method 300 includes detecting, by a monitoring device, the presence of one or more surge protection device components. In an example, this may be referred to as discovery mode, during which the presence of surge protection device components are discovered. The discovery mode may also include comparing the detected components to a database, or list, of configuration structures to determine measurement locations. At block 320, the method 300 includes generating, by the monitoring device, a list of measurement locations based on the detected one or more surge protection device components. At block 330, the method 300 includes measuring, by the monitoring device for each measurement location, a status of the one or more surge protection device components. Block 330 may generally be referred to as measurement mode. At block 340, the method includes generating an output, by a monitoring device. The output generated at block 340 is based at least in part on the status determined at block 330. The output generated at block 340 may include a sending a message, setting a flag, displaying an alert, or otherwise providing an indication of a change in the status, or health, of a surge protection device component.

The method 300 may further include halting a measurement. For example, at block 330, the method may further include halting the status measurement. The method 300 may further include continuing, or re-starting, a measurement. For example, if the status measurement at block 330 is halted, the method may further include continuing the status measurement (from the previous location) or re-starting the status measurement. The method 300 may further include performing one of the blocks additional times. As just one example, method 300 may perform the discovery mode multiple times, such as at block 310, between blocks 320 and 330, between blocks 330 and 340, and/or after block 340.

The measurement mode of method 300 may further include an indication of the percentage health of the entire module (e.g., from 0-100), a percentage health of a protection mode (e.g., from 0-100), and the percentage health of particular component (e.g., fuses) on a protection mode (e.g., from 0-100), among other indications of technology, configuration, calibrations, sensors, and/or components.

Figure 4:
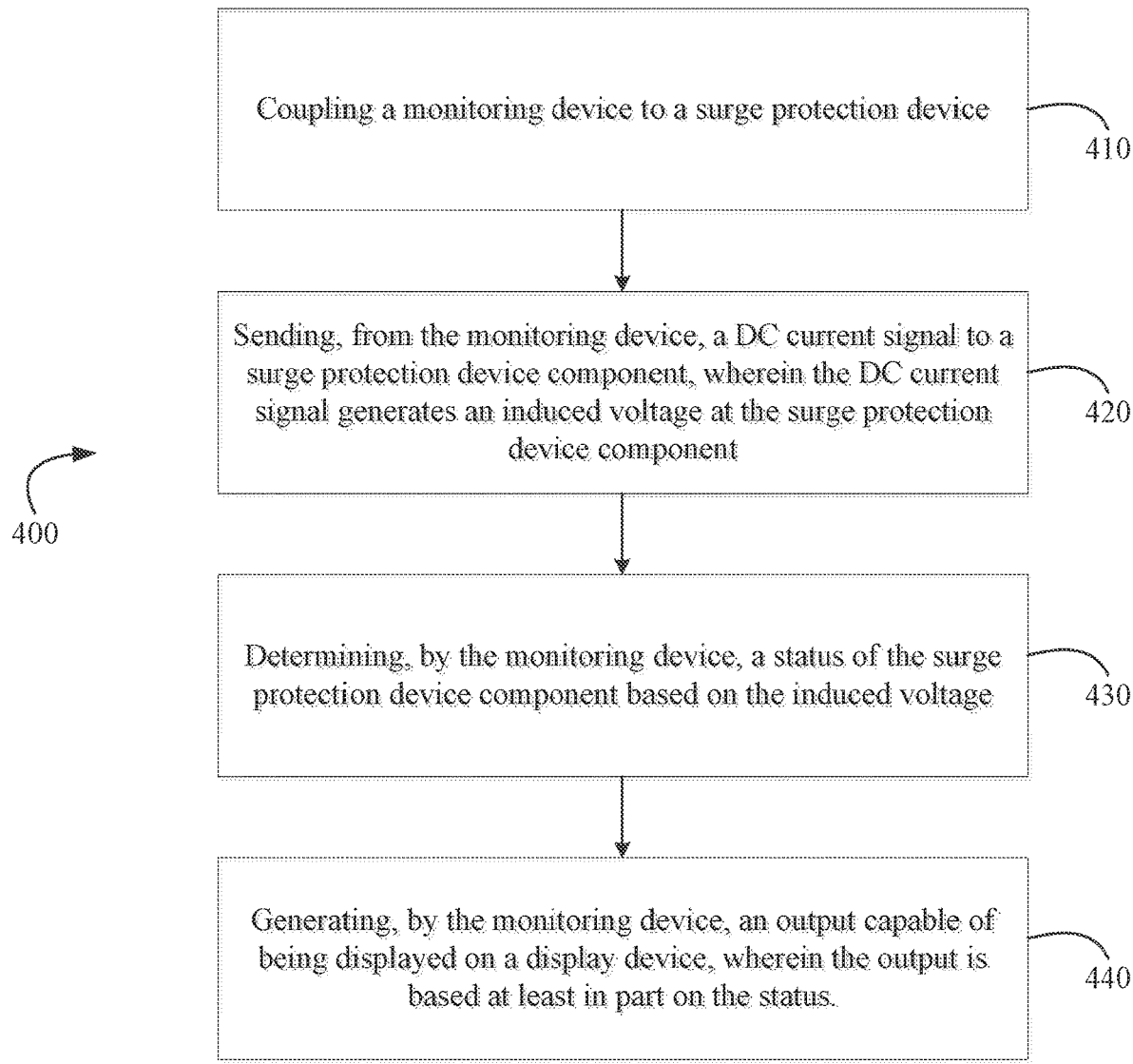
FIG. 4 is a flow chart of an example method for monitoring surge protection components.

FIG. 4 is a flow chart of an example method for monitoring surge protection components. Method 400 shown in FIG. 4 presents an embodiment of a method that could be used by the device 100 in FIG. 1, the device 200 in FIG. 2, or components of any of the above, for example.

At block 410, the method 400 includes coupling a monitoring device to a surge protection device. At block 420, the method 400 includes sending, from the monitoring device, a DC current signal to a surge protection device component. The DC current signal of block 420 generates an induced voltage at the surge protection component. At block 430, the method 400 includes determining, by the monitoring device, a status of the surge protection device component based on the induced voltage. At block 440, the method 400 includes generating, by the monitoring device, an output capable of being displayed on a display device. The generated output is based at least in part on the status determined at block 430.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed:

1. A computer-implemented method comprising:
    inducing, by a monitoring device having a processor, a voltage at a component of a surge protection device;
    measuring, by an analog to digital converter component that is separate, but coupled to the processor, the voltage induced at the component of the surge protection device;
    determining, by the monitoring device, a status of the component of the surge protection device responsive to the measured induced voltage; and
    generating, by the monitoring device, an output based on the determined status of the component of the surge protection device.

2. The method of claim 1, wherein the induced voltage is generated by a DC current signal.

3. The method of claim 2, wherein inducing the voltage at the component of the surge protection device comprises sending, by the monitoring device, the DC current signal to the component of the surge protection device.

4. The method of claim 1, wherein determining the status of the component of the surge protection device responsive to the induced voltage comprises measuring a temperature of the component of the surge protection device.

5. The method of claim 1, wherein the generated output comprises at least one of sending a message, setting a flag, displaying an alert, or otherwise providing an indication of a change in the status of the component of the surge protection device.

6. The method of claim 1, further comprising determining, by the monitoring device, information relating to the component of the surge protection device, wherein the determined information comprises an identification of at least one of a surge protection device technology, a mode setup, a calibration setting, a surge capacity, a temperature measurement or a component configuration.

7. The method of claim 1, further comprising using, by the monitoring device, data of a manufacturer of surge protection devices to determine information relating to the component of the surge protection device.

8. The method of claim 1, wherein the component of the surge protection device comprises at least one of a varistor, a thermistor, a resistor, a capacitor, an inductor, a fuse or a sensor.

9. A monitoring device comprising:
    a processor;
    an analog to digital converter component that is separate, but coupled to the processor; and
    a memory including computer program code, which when executed by the processor, causes the monitoring device to:
    induce a voltage at a component of a surge protection device;

measure, by the analog to digital converter, the voltage induced at the component of the surge protection device;

determine a status of the component of the surge protection device responsive to the measure induced voltage; and generate an output based on the determined status of the component of the surge protection device.

10. The monitoring device of claim 9, wherein the induced voltage is generated by a DC current signal.

11. The monitoring device of claim 10, wherein inducing the voltage at the component of the surge protection device comprises sending, by the monitoring device, the DC current signal to the component of the surge protection device.

12. The monitoring device of claim 9, wherein determining the status of the component of the surge protection device responsive to the induced voltage comprises measuring a temperature of the component of the surge protection device.

13. The monitoring device of claim 9, wherein the generated output comprises at least one of sending a message, setting a flag, displaying an alert, or otherwise providing an indication of a change in the status of the component of the surge protection device.

14. The monitoring device of claim 9, wherein the memory further includes computer program code, which when executed by the processor, causes the monitoring device to determine information relating to the component of the surge protection device, wherein the determined information comprises an identification of at least one of a surge protection device technology, a mode setup, a calibration setting, a surge capacity, a temperature measurement or a component configuration.

15. The monitoring device of claim 9, wherein the memory further includes computer program code, which when executed by the processor, causes the monitoring device to use data of a manufacturer of surge protection devices to determine information relating to the component of the surge protection device.

16. The monitoring device of claim 9, wherein the component of the surge protection device comprises at least one of a varistor, a thermistor, a resistor, a capacitor, an inductor, a fuse or a sensor.

17. The monitoring device of claim 9, wherein the monitoring device is coupled to the surge protection device.

* * * * *